(12) United States Patent
Kamon

(10) Patent No.: US 8,839,176 B2
(45) Date of Patent: Sep. 16, 2014

(54) SEMICONDUCTOR INTEGRATED CIRCUIT AND PATTERN LAYOUTING METHOD FOR THE SAME

(71) Applicant: Renesas Electronics Corporation, Kawasaki (JP)

(72) Inventor: Kazuya Kamon, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/975,823

(22) Filed: Aug. 26, 2013

(65) Prior Publication Data

US 2014/0035108 A1 Feb. 6, 2014

Related U.S. Application Data

(62) Division of application No. 13/082,858, filed on Apr. 8, 2011, now Pat. No. 8,543,956.

(30) Foreign Application Priority Data

Apr. 13, 2010 (JP) ................................. 2010-092474

(51) Int. Cl.
*G06F 17/50* (2006.01)
*H01L 23/544* (2006.01)
*H03K 19/173* (2006.01)
*G06F 7/38* (2006.01)
*H01L 25/00* (2006.01)
*H01L 21/3105* (2006.01)
*H01L 27/02* (2006.01)

(52) U.S. Cl.
CPC ........ *H01L 23/544* (2013.01); *H01L 21/31053* (2013.01); *H01L 2223/54453* (2013.01); *H01L 27/0203* (2013.01); *G06F 17/5072* (2013.01); *H01L 2223/54426* (2013.01)
USPC ........... 716/124; 716/110; 716/118; 716/119; 716/122; 257/620; 326/37; 326/41

(58) Field of Classification Search
USPC ............ 716/110, 118–119, 122, 124; 326/37, 326/41; 257/620
See application file for complete search history.

(56) References Cited

U.S. PATENT DOCUMENTS 5,970,238 A 10/1999 Shibata et al.
6,693,357 B1 2/2004 Borst et al.
(Continued)

FOREIGN PATENT DOCUMENTS

JP 09-081622 3/1997
JP 09-306996 A 11/1997
(Continued)

OTHER PUBLICATIONS

Entire Prosecution of U.S. Appl. No. 13/082,858, filed Apr. 8, 2011 to Kazuya Kamon entitled "Semiconductor Integrated Circuit and Pattern Layout Method for the Same".

(Continued)

*Primary Examiner* — Stacy Whitmore
(74) *Attorney, Agent, or Firm* — McDermott Will & Emery LLP

(57) ABSTRACT

A semiconductor integrated circuit and a pattern lay-outing method for the same are disclosed, which can suppress bending or partial drop-out of a dummy pattern even when a mechanical stress acts on the dummy pattern in CMP. The semiconductor integrated circuit includes predetermined functional areas and a dummy pattern formed in a space area. The space area is positioned between predetermined functional areas. The dummy pattern includes a first metal portion formed in the shape of a frame and defining an outer edge of the dummy pattern, a second metal portion positioned on an inner periphery side of the first metal portion and formed so as to be continuous with the first metal portion, and a plurality of non-forming areas positioned in an area where the second metal portion is not formed on the inner periphery side of the first metal portion.

5 Claims, 16 Drawing Sheets

(56) References Cited

U.S. PATENT DOCUMENTS

| | | |
|---|---|---|
| 6,710,449 B2 | 3/2004 | Hyoto et al. |
| 6,781,332 B2 | 8/2004 | Kusase |
| 6,784,548 B2 | 8/2004 | Kouno et al. |
| 6,838,736 B2 | 1/2005 | Ishikura et al. |
| 6,882,024 B2 | 4/2005 | Sawamura |
| 6,883,149 B2 | 4/2005 | Li et al. |
| 6,892,363 B2 | 5/2005 | Li |
| 7,062,732 B2 | 6/2006 | Ito et al. |
| 7,339,256 B2 | 3/2008 | Nakamura et al. |
| 8,122,386 B2 | 2/2012 | Kobayashi |
| 2001/0027008 A1 | 10/2001 | Matsumoto |
| 2007/0174802 A1 | 7/2007 | Shin et al. |
| 2008/0148207 A1 | 6/2008 | Matsubara |
| 2009/0049420 A1 | 2/2009 | Kobayashi |
| 2009/0187878 A1 | 7/2009 | Ogino et al. |
| 2009/0278569 A1 | 11/2009 | Taoka et al. |
| 2010/0003819 A1 | 1/2010 | Taguchi et al. |
| 2011/0004859 A1* | 1/2011 | Summerfelt et al. ......... 716/124 |
| 2011/0095374 A1 | 4/2011 | Kawahara et al. |

FOREIGN PATENT DOCUMENTS

| | | |
|---|---|---|
| JP | 2001-217248 A | 8/2001 |
| JP | 2001-274255 A | 10/2001 |
| JP | 2002-190516 A | 7/2002 |
| JP | 2004-282071 A | 10/2004 |
| JP | 2005-229086 A | 8/2005 |
| JP | 2009-64857 A | 3/2009 |
| JP | 2009-064857 A | 3/2009 |

OTHER PUBLICATIONS

Notification of Reasons for Refusal Japanese Patent Application No. 2010-092474 dated Dec. 17, 2013 with English language translation.

Japanese Office Action issued in Japanese Application No. 2010-092474 dated Jun. 3, 2014, w/English translation.

* cited by examiner

SEMICONDUCTOR INTEGRATED CIRCUIT AND PATTERN LAYOUTING METHOD FOR THE SAME

INCORPORATION BY REFERENCE

This application is a Divisional of U.S. application Ser. No. 13/082,858, filed on Apr. 8, 2011, which claims priority of Japanese Patent Application No. JP 2010-92474 filed on Apr. 13, 2010, including the specification, drawings and abstract are incorporated herein by reference in their entirety.

BACKGROUND

The present invention relates to a semiconductor integrated circuit and a pattern lay-outing method for the same. Particularly, the present invention is concerned with a semiconductor integrated circuit having a dummy pattern within a chip and a pattern lay-outing method for the semiconductor integrated circuit.

A semiconductor integrated circuit is used in manufacturing a microdevice such as, for example, semiconductor device, liquid crystal display device, charge coupled device (CCD), or thin-film magnetic head.

Within the semiconductor integrated circuit is formed a dummy pattern in addition to various functional modules (e.g., memory, analog and logic modules). For example, the dummy pattern is formed to diminish concaves and convexes formed in an interlayer dielectric film (see Patent Documents 1 and 2 below) and it is formed also for improving the uniformity of a pattern share (see Patent Document 3 below).

Various functional modules and a dummy pattern are formed on the surface of a semiconductor wafer. The semiconductor wafer surface with various functional modules and a dummy pattern formed thereon is subjected to chemical mechanical polishing (CMP).

In CMP, abrasive cloth is pushed against the surface of the semiconductor wafer and the semiconductor wafer is revolved while being rotated on its own axis under the flow of slurry containing a fine powder of alumina or of $SiO_2$ onto the surface of the semiconductor wafer. By CMP, the surface of the semiconductor wafer is polished into a flat surface. As a result, it becomes possible to use an exposure system with a shallow focal depth. Transfer of a fine pattern becomes possible with use of a projection lens having a large numerical aperture (NA).

PATENT DOCUMENTS AS PRIOR ART DOCUMENTS

1. Japanese Unexamined Patent Publication No. Hei 9 (1997)-81672
2. Japanese Unexamined Patent Publication No. Hei 9 (1997)-306996
3. Japanese Unexamined Patent Publication No. 2009-64857

SUMMARY

The dummy pattern described in each of the above patent documents is comprised of plural metal portions. The metal portions are arranged each independently like an island. By "like an island" as referred to herein is meant for example a shape such that an outer edge of a metal portion is rectangular with the inside of the rectangle being wholly filled up with the metal portion.

In CMP, when polishing the surface of the semiconductor wafer, a mechanical stress acts on the dummy pattern (metal portions) from all sides. If a mechanical stress larger than a predetermined value acts on the dummy pattern, bending or partial drop-out of the dummy pattern may result.

It is an object of the present invention to provide a semiconductor integrated circuit and a pattern lay-outing method for the same, capable of suppressing bending or partial drop-out of a dummy pattern even when a mechanical stress acts on the dummy pattern in CMP.

A semiconductor integrated circuit based on one aspect of the present invention comprises functional areas formed within a chip and including scribing areas, module areas and an I/O area, as well as a dummy pattern formed in a space area within the chip.

The space area is defined between functional areas, within a functional area, and/or at a position spanning an area where a functional area is formed and an area where a functional area is not formed. The dummy pattern includes a first metal portion formed in the shape of a frame and defining an outer edge of the dummy pattern, a second metal portion positioned on an inner periphery side of the first metal portion and formed so as to be continuous with the first metal portion, and a plurality of non-forming areas positioned in areas on the inner periphery side of the first metal portion with the second metal portion not formed therein.

A pattern lay-outing method for a semiconductor integrated circuit based on another aspect of the present invention is for lay-outing a pattern in the semiconductor integrated circuit described above and comprises the steps of preparing reference plotting data defined by the functional areas formed within the chip, oversizing the reference plotting data by a predetermined width, subtracting the oversized reference plotting data from the chip to calculate the space area, forming, within the space area, island areas having a shape corresponding to the non-forming areas, and subtracting the island areas from a space area positioned inside the outer edge of the dummy pattern to be formed.

A pattern lay-outing method for a semiconductor integrated circuit based on a further aspect of the present invention is for lay-outing a pattern in the semiconductor integrated circuit described above and comprises the steps of preparing a reference plotting data defined by the functional areas formed within the chip, oversizing the reference plotting data by a predetermined width, subtracting the oversized reference plotting data from the chip to calculate the space area, extracting a space area with a share not larger than a predetermined share from within the space area, forming island areas within the space area with a share not larger than the predetermined share, the island areas having a shape corresponding to the non-forming areas, and subtracting the island areas from a space area with a share not larger than the predetermined share and positioned inside the outer edge of the dummy pattern to be formed.

According to the present invention it is possible to provide a semiconductor integrated circuit and a pattern lay-outing method for the same, capable of suppressing bending or partial drop-out of a dummy pattern even when a mechanical stress acts on the dummy pattern in CMP.

DETAILED DESCRIPTION

Figure 1:
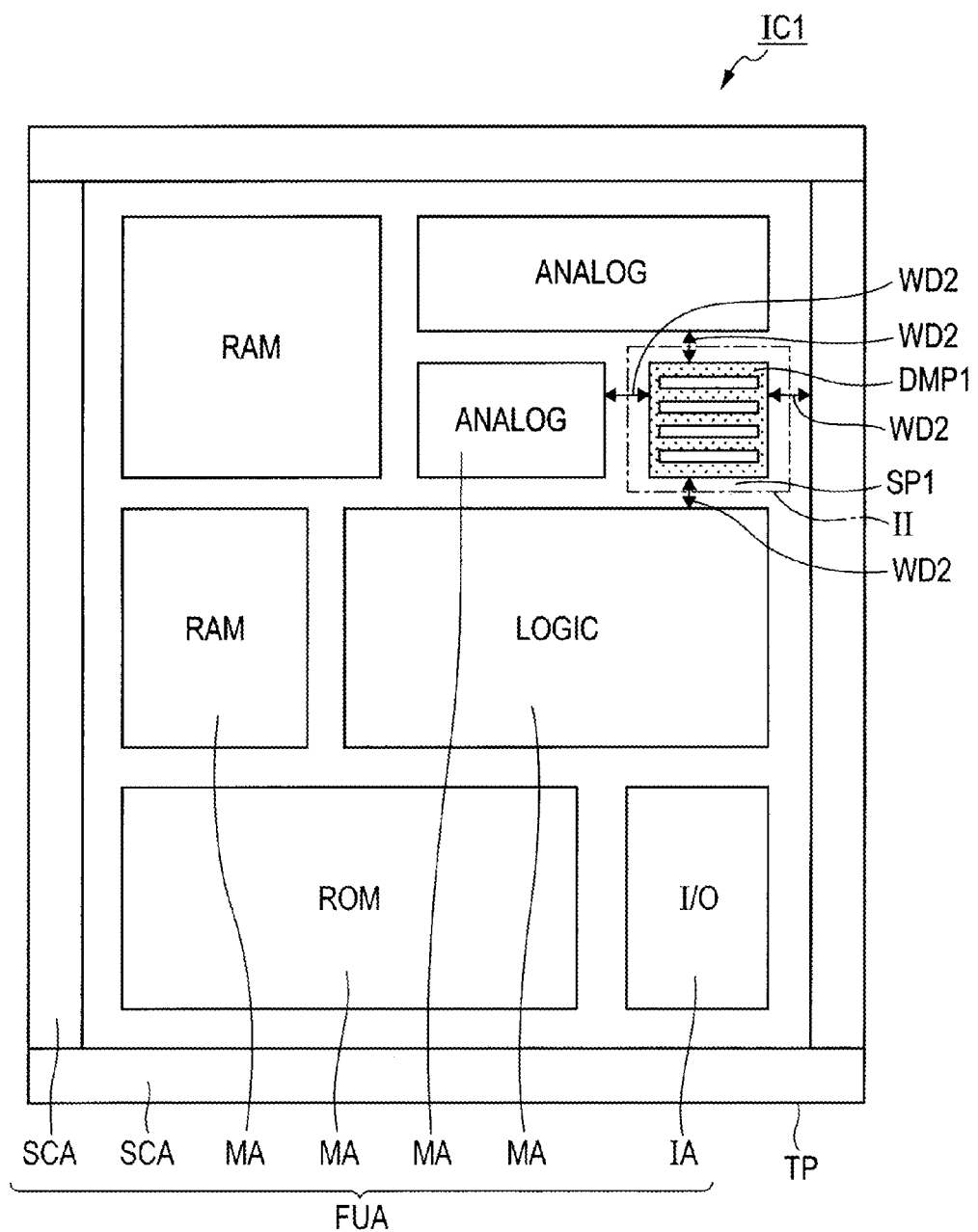
FIG. 1 is a plan view showing a semiconductor integrated circuit according to a first embodiment of the present invention.

Semiconductor integrated circuits and pattern lay-outing methods for the same according to embodiments of the present invention will be described below with reference to the drawings. In the following embodiments, when reference is made to, for example, the number of elements and quantity, the scope of the present invention is not always limited to the number and quantity referred to unless otherwise specified. Moreover, in the following embodiments, the same parts and equivalent parts will be denoted by the same reference numerals and repeated explanations thereof will be omitted.

First Embodiment

A semiconductor integrated circuit IC1 according to this first embodiment will be described with reference to FIGS. 1 and 2. Referring to FIG. 1, the semiconductor integrated circuit IC1 is formed in the shape of a chip. The semiconductor integrated circuit IC1 includes functional areas FUA formed within a chip TP and a dummy pattern DMP1 formed in a space area SP1 (to be described below in detail) within the chip TP.

The functional modules FUA include scribing areas SCA, module areas MA and an I/O area IA. The scribing areas SCA are formed at peripheral edges of the chip TP so as to surround the module areas MA and the I/O area IA. The scribing areas SCA are formed for dicing. In the scribing areas SCA are formed scribing Test Elementary Group (TEG) patterns (not shown) for monitoring the degree of finish in manufacturing the semiconductor integrated circuit IC1, such as, for example, side monitor, alignment mark and resolving power chart.

In the module areas MA are formed for example memories (RAM, ROM) and logic and analog modules. Generally, the size and shape of each module area and I/O area IA are multifarious. A space area SP1 occurs between module areas MA or between a module area(s) MA and the I/O area IA.

Each module area MA and the I/O area IA are designed so that the space area SP1 becomes as small as possible. The space area SP1 is utilized for forming a dummy pattern DMP1 to be described later. The space area SP1 is utilized also for exchange of signals between modules (e.g., memories) or for preventing interference between signals or propagation of noise.

Figure 2:
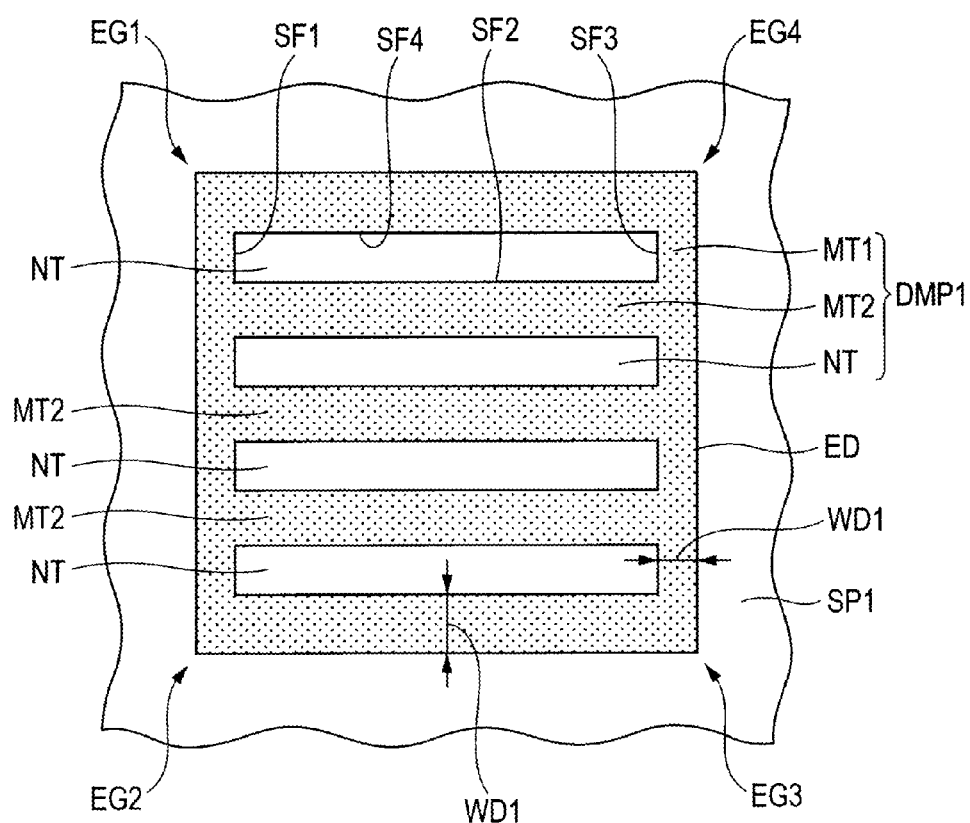
FIG. 2 is a plan view showing on a larger scale an area enclosed with line II in FIG. 1.

FIG. 2 is a plan view showing on a larger scale the area enclosed with line II in FIG. 1. FIG. 2 shows the dummy pattern DMP1 used in this embodiment.

Referring to FIG. 2, the dummy pattern DMP1 is formed in the space area SP1 as noted above. In this embodiment the dummy pattern DMP1 is formed substantially in a square shape. The dummy pattern DMP1 includes a first metal portion MT1 formed in a frame shape, three second metal portions MT2 each formed in a band shape, and four non-forming areas NT each formed in a band shape. It is preferable that the first and second metal portions MT1, MT2 have the same material and thickness as those of, for example, wiring lines formed around them.

At the outermost periphery of the dummy pattern DMP1 the first metal portion MT1 is formed in the shape of a frame having a predetermined width WD1. The first metal portion MT1 (an outer periphery thereof) defines outer edges ED of the dummy pattern DMP1. The second metal portions MT2 are positioned on an inner periphery side of the first metal portion MT1. The second metal portions MT2 are arranged vertically at predetermined intervals. The second metal portions MT2 are each continuous with the first metal portion MT1 at both ends thereof. The non-forming areas NT are positioned on the inner periphery side of the first metal portion MT1. On the inner periphery side of the first metal portion MT1 the non-forming areas NT are positioned in areas not formed with the second metal portions MT2.

It is preferable that the dummy pattern float electrically. With the dummy pattern floating electrically, when an electric signal passes through a wiring line disposed near the dummy pattern DMP1, it is possible to prevent charge or discharge of the dummy pattern DMP1. It is also possible to prevent unnecessary electric power from being generated in the wiring line disposed near the dummy pattern DMP1, or the waveform of an electric signal passing through the wiring line near the dummy pattern DMP1 can be prevented from being distorted.

A predetermined spacing WD2 (also designated a safe area) is provided between the dummy pattern DMP 1 (an outer edge ED thereof) and each module area MA or I/o area IA. The predetermined spacing WE2 is, for example, about 1 μm. By ensuring the predetermined spacing WD2 it is possible to prevent the occurrence of a capacitance not reflected in circuit simulation or prevent the failure to occur of a capacitance not reflected in circuit simulation.

(Function & Effect)

CMP is performed for the semiconductor integrated circuit IC1 configured as above. Referring to FIG. 2, in CMP, a mechanical stress acts from all sides on the dummy pattern DMP1 (the first metal portion MT1 or the second metal portions MT2). Portions of the dummy pattern DMP1 apt to drop out as a result of a mechanical stress acting on the dummy pattern are particularly corners EG1 to EG4 (four corners) of the outer edges ED.

The dummy pattern explained at the beginning of this specification is comprised of plural metal portions which are independent portions like islands (see Patent Documents 1 to 3). A large number of corners exist in the dummy pattern described at the beginning of this specification. For example, in the case where four island-like metal portions are formed, the number of corners is 4×4=16.

A comparison in the number of corners between the dummy pattern DMP1 in this embodiment and the dummy pattern referred to at the beginning of this specification shows that the former is the smaller. According to the dummy pattern DMP1, since the number of corners is the smaller, it becomes possible to so much suppress drop-out of the dummy pattern DMP1.

In the dummy pattern DMP1, a mechanical stress also acts for example on a face SF1 from all sides. A mechanical stress acts to cause a part of the face SF1 to be dropped out or acts to bend the first metal portion MT1 including the face SF1. The face SF1 is continuous with faces SF2 and SF4. In other words, the face SF1 is supported by the faces SF2 and SF4. The three faces SF1, SF2 and SF4 resist the mechanical stress imposed on the face SF1.

According to the dummy pattern DMP1 in this embodiment, since the three faces SF1, SF2 and SF4 resist the mechanical stress acting on the face SF1, it becomes possible to suppress bending or partial drop-out of the dummy pattern DMP1 (the first metal portion MT1).

Upon bending or partial drop-out of the dummy pattern, it becomes impossible for the dummy pattern to exhibit desired characteristics. According to the semiconductor integrated circuit of this embodiment, since drop-out of the dummy pattern DMP1 is suppressed, it also becomes possible to suppress deterioration in characteristics of the dummy pattern.

In CMP, the dropped-out part of the dummy pattern moves on the surface of a semiconductor wafer while being forced down against abrasive cloth. With the movement of a part of the dummy pattern, adjacent patterns are damaged one after another. A part of the dummy pattern moves vertically on the semiconductor wafer (tornado mode). According to the semiconductor integrated circuit of this embodiment, the occurrence of such damage can also be suppressed because drop-out of the dummy pattern DMP1 is suppressed.

To prevent the occurrence of drop-out of the dummy pattern it is also possible to reduce the abrasive cloth urging pressure or decrease the number of revolutions, which, however, results in decrease of the polishing speed. A longer processing time is needed to ensure a desired amount of polishing. According to the semiconductor integrated circuit of this embodiment, since drop-out of the dummy pattern DMP1 is suppressed, it is possible to manufacture the semiconductor integrated circuit in a shorter time and also possible to improve the manufacturing yield.

Further, the dummy pattern DMP1 can be disposed for improving the uniformity of pattern share. In this case, a share necessary for the space area SP1 is calculated. The area (width) of the first metal portion MT1 and that of each second metal portion MT2 are made large or small according to the required share, whereby it is possible to obtain a desired share.

Another Example in First Embodiment

Figure 3:
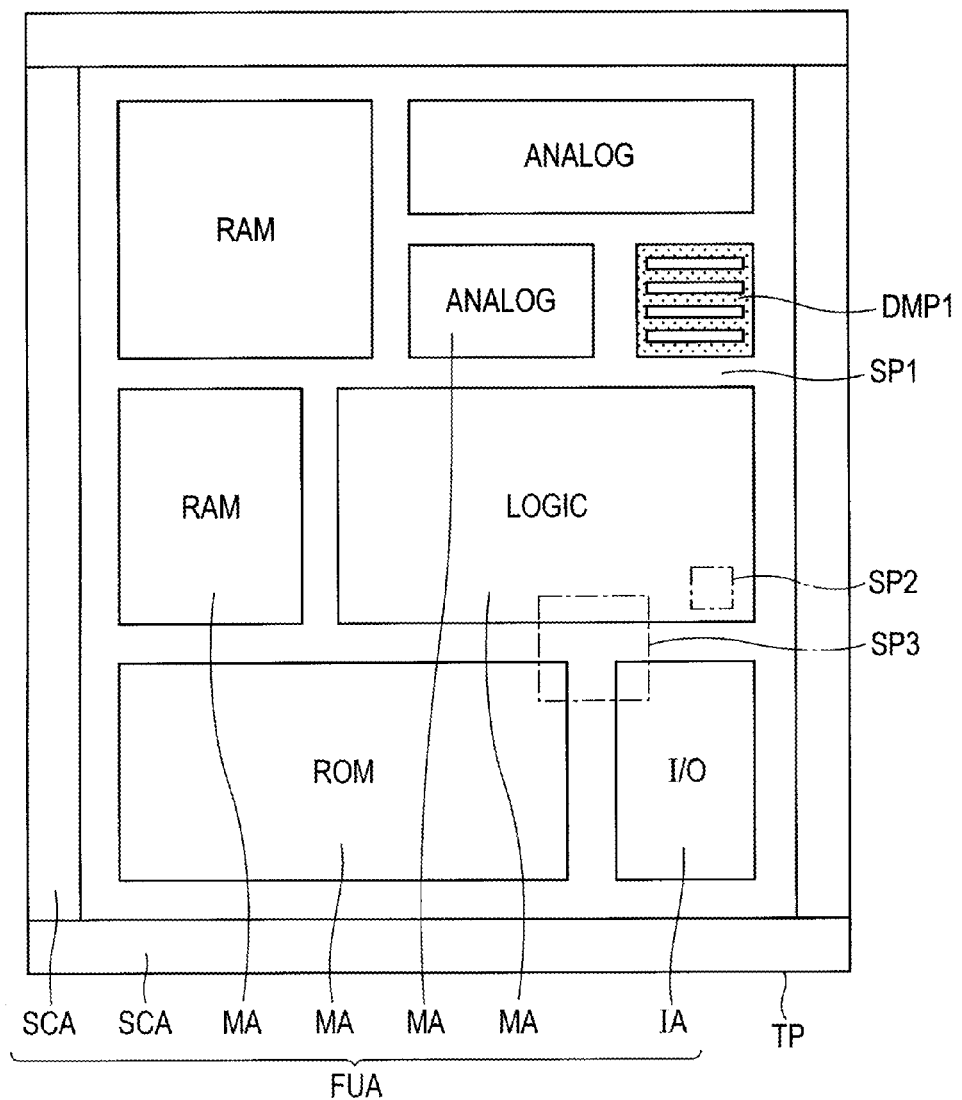
FIG. 3 is a plan view showing another example of a semiconductor integrated circuit in the first embodiment.

Referring to FIG. 3, a dummy pattern may be formed in a space area SP2. The space area SP2 is positioned within a functional area FUA (e.g., a logic module). Also for the space area SP2 there may be formed the same dummy pattern as in the first embodiment. Also with the dummy pattern formed in the space area SP2 there can be obtained the same functions and effects as in the first embodiment.

A dummy pattern may be formed in a space area SP3. The space area SP3 is positioned so as to span the inside of the area (module area MA) formed with various modules within the chip TP and the area not formed with various modules within the chip TP. Also for the space area SP3 there can be formed the same dummy pattern as in the first embodiment. Also with the dummy pattern formed in the space area SP3 it is possible to obtain the same functions and effects as in the first embodiment.

Second Embodiment

Figure 4:
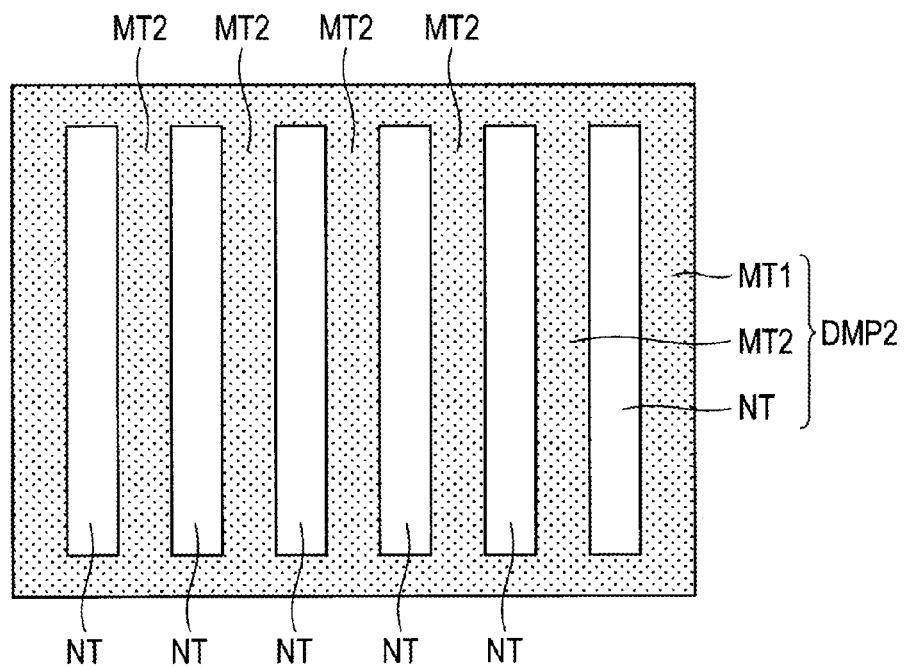
FIG. 4 is a plan view showing a dummy pattern used in a semiconductor integrated circuit according to a second embodiment of the present invention.

Referring to FIG. 4, a dummy pattern may be formed in a rectangular shape as a dummy pattern DMP2. The dummy pattern DMP2 includes a first metal portion MT1 formed in the shape of a frame, five second metal portions MT2 each formed in a band shape, and six non-forming areas NT. Also with the dummy pattern DMP2 it is possible to obtain the same functions and effects as in the first embodiment.

Third Embodiment

Figure 5:
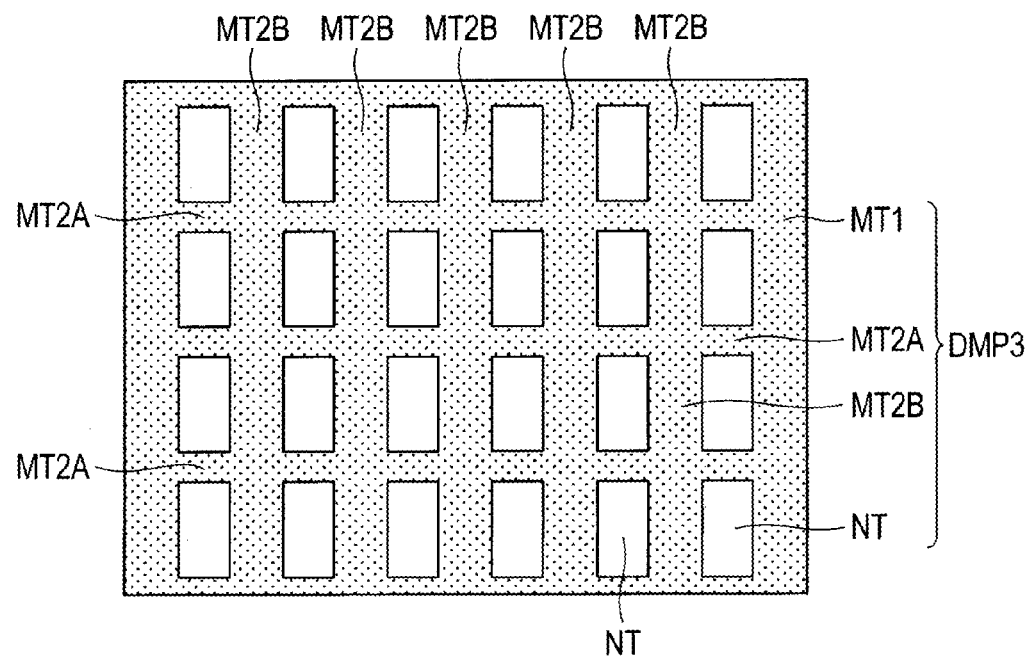
FIG. 5 is a plan view showing a dummy pattern used in a semiconductor integrated circuit according to a third embodiment of the present invention.

Referring to FIG. 5, a description will now be given about a dummy pattern DMP3 used in this third embodiment. The dummy pattern DM3 includes a first metal portion MT1 formed in the shape of a frame, three second metal portions MT2A each formed in a band shape, five second metal portions MT2B each formed in a band shape and orthogonal to the second metal portions MT2A, and plural (twenty-four) non-forming areas NT. With the dummy pattern DMP3 it is possible to obtain the following effects in addition to the same functions and effects as in the first embodiment.

According to the dummy pattern DMP3, a mechanical stress acting on the dummy pattern DMP3 (first metal portion MT1 and second metal portions MT2A and third metal portions MT2B) is dispersed and becomes small. Bending of the dummy pattern DMP3 (first and second metal portions MT1, MT2A, MT2B) becomes less possible. In the dummy pattern DMP3, three second metal portions MT2A straddle one second metal portion MT2B. Each second metal portion MT2B is divided into a quarter length, so that the probability of bending of the second metal portions MT2B becomes one fourth of the second metal portions MT2 (see FIG. 4) in the second embodiment.

Fourth Embodiment

Figure 6:
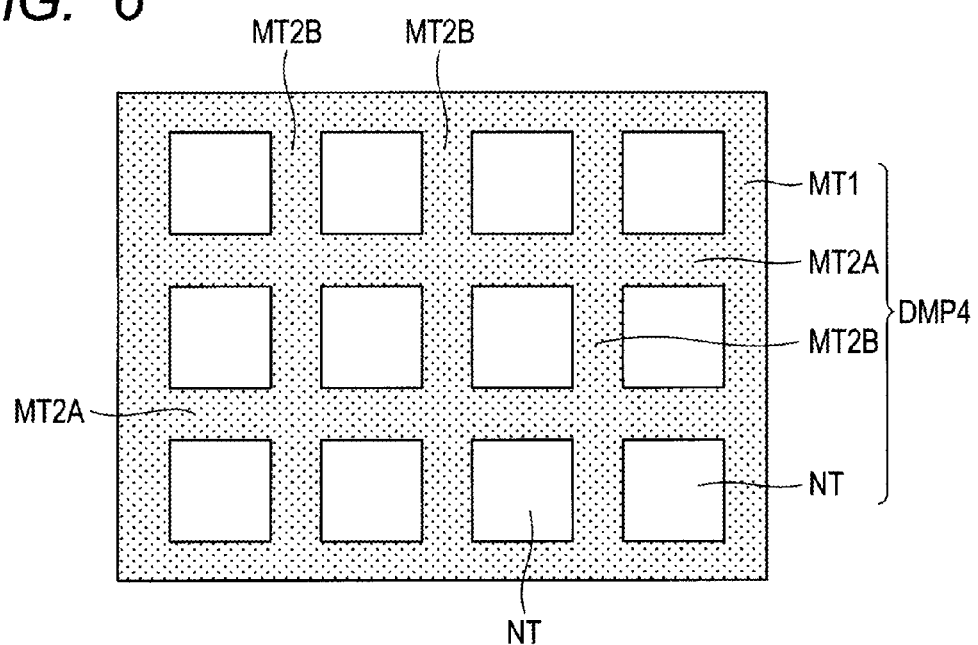
FIG. 6 is a plan view showing a dummy pattern used in a semiconductor integrated circuit according to a fourth embodiment of the present invention.

Referring to FIG. 6, each non-forming area NT may be formed in a square shape as in a dummy pattern DMP4. The dummy pattern DMP4 includes a first metal portion MT1 formed in the shape of a frame, two second metal portions MT2A each formed in a band shape, three second metal portions MT2B each formed in a band shape, and plural (twelve) non-forming areas NT. Also with the dummy pattern DMP4 it is possible to obtain the same functions and effects as in the first and third embodiments.

Fifth Embodiment

Figure 7:
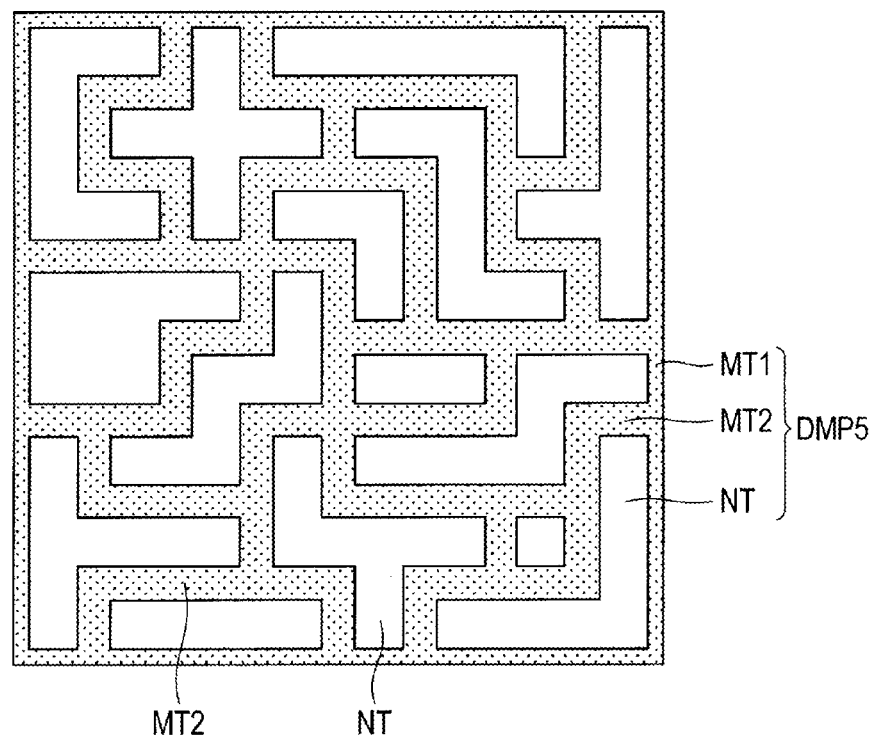
FIG. 7 is a plan view showing a dummy pattern used in a semiconductor integrated circuit according to a fifth embodiment of the present invention.

Referring to FIG. 7, there may be used non-forming areas NT having two or more shapes like a dummy pattern DMP5. The non-forming areas NT may be formed so that all of them are different in shape. Also with the dummy pattern DMP5 it is possible to obtain the same functions and effects as in the first embodiment. In the dummy pattern DMP5, by forming the non-forming areas NT so that their shapes do not have periodicity, an electromagnetic noise or the like generated around the dummy pattern DMP5 can be shut off more effectively.

Sixth Embodiment

A dummy pattern DMP6 used in this sixth embodiment will now be described with reference to FIGS. 8 and 9. First, a description will be given about Fibonacci sequence. Fibonacci sequence is a sequence named after an Italian mathematician, Leonardo Fibonacci (Leonard of Pisa). The $n^{th}$ Fibonacci number Fn is defined by $F_0=0$, $F_1=1$, $F_{n+2}=F_n+F_{n+1}$. The initial terms are 0, 1, 1, 2, 3, 5, 8, 13, 21, 34, 55, 89, 144, 233, 377, 610, 987, (the rest is omitted). In Fibonacci sequence, any term is the sum of two preceding terms.

Figure 8:
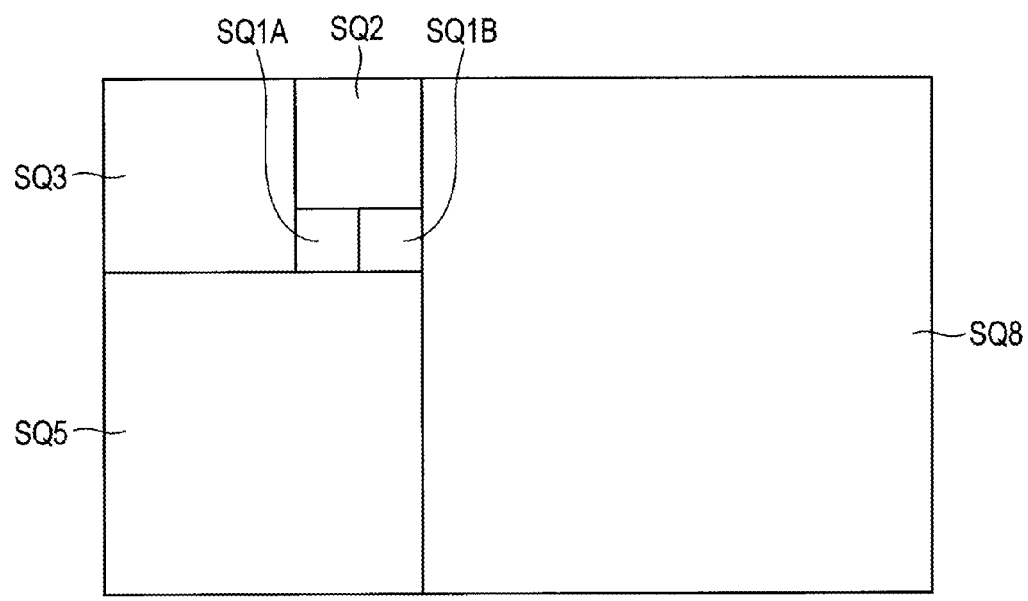
FIG. 8 is a plan view showing a state in which squares each with one side length based on Fibonacci sequence are arranged adjacently and spirally in connection with a sixth embodiment of the present invention.

In FIG. 8, as to squares SQ1A, SQ1B, SQ2, SQ3, SQ5 and SQ8 (hereinafter referred to also as "each square"), the ratio of one side satisfies Fibonacci sequence. The squares are arranged spirally in an adjacent state and in order from smaller to larger one side length. The outermost periphery of the area where the squares are arranged describes a rectangle.

Figure 9:
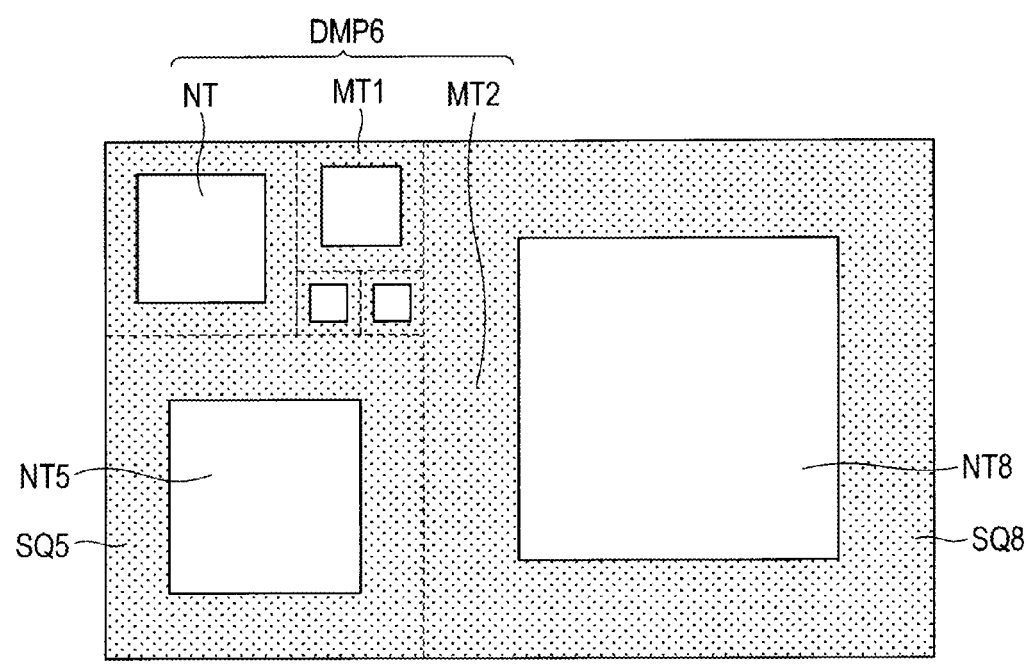
FIG. 9 is a plan view showing a dummy pattern used in a semiconductor integrated circuit according to the sixth embodiment.

Referring to FIG. 9, the dummy pattern DMP6 in this embodiment has a rectangular outer edge. Plural non-forming areas NT are each formed in a generally quadrangular shape, but preferably they are each formed in a generally square shape.

In the case where the foregoing squares (SQ1A to SQ8) are defined on the dummy pattern DMP6, the non-forming areas NT in this embodiment are arranged so as to be included in those squares respectively. For example, the non-forming area NT8 is disposed so as to be included in one square SQ8 which satisfies Fibonacci sequence, while the non-forming area NT5 is disposed so as to be included in another square SQ5 which satisfies Fibonacci sequence.

It is preferable that the dummy pattern DMP6 in this embodiment be configured so as to have self-analogy as a whole. In other words, it is preferable that the shape comprised of one square SQ8 which satisfies Fibonacci sequence and the non-forming area NT8 formed within the one square SQ8 and the shape comprised of another square SQ5 which satisfies Fibonacci sequence and the non-forming area NT5 formed within the another square SQ5 be in an analogous relation.

Also with the dummy pattern DMP6 it is possible to obtain the same functions and effects as in the first embodiment. In the dummy pattern DMP6, the shape of the non-forming areas NT does not have periodicity, whereby an electromagnetic noise or the like generated around the dummy pattern DMP6 can be shut off more effectively.

Seventh Embodiment

A dummy pattern DMP7 in this seventh embodiment will be described with reference to FIG. 10. Plural non-forming areas NT in the dummy pattern DMP7 are arranged in the shape of a fractal pattern.

The "fractal" is a geometrical concept introduced by a French mathematician, Benoit B. Mandelbrot. The "fractal" includes a case where a part of a graphic and the whole of the graphic are self-analogous. The "fractal" is defined to be such a set as Hausdorff dimension exceeds a topological dimension strictly. In a completely self-analogous fractal structure, Hausdorff dimension is equal to Minkowski dimension.

Figure 10:
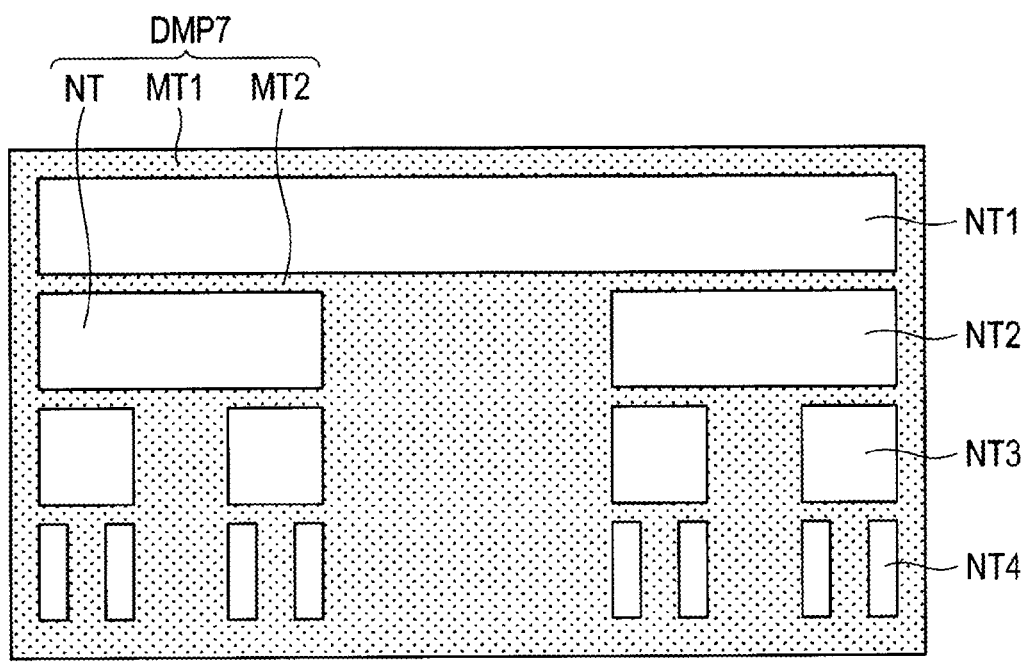
FIG. 10 is a plan view showing a dummy pattern used in a semiconductor integrated circuit according to a seventh embodiment of the present invention.

In the dummy pattern DMP7, as shown in FIG. 10, non-forming areas are arranged Cantor set-like as an example of a fractal structure. In Cantor set, a segment is divided into three portions and the central portion is removed, further, the remaining portion is further divided into three portions, of which the central portion is removed. Cantor set is one of fractal structures obtained by repeating the operations just mentioned above. A fractal dimension in Cantor set is 0.63.

In the dummy pattern DMP7, a length resulting from multiplying the length in the right-and-left direction of a non-forming area NT1 in FIG. 10 by one-third and the length in the same direction of a non-forming area NT2 adjacent to NT1 are equal. Likewise, a length resulting from multiplying the length in the right-and-left direction in the same figure of the non-forming area NT2 by one-third and the length in the same direction of a non-forming area NT3 adjacent to NT2 are equal. A length resulting from multiplying the length in the right-and-left direction in the same figure of the non-forming area NT3 by one-third and the length in the same direction of a non-forming area NT4 adjacent to NT3 are equal.

Also with the dummy pattern DMP7 it is possible to obtain the same functions and effects as in the first embodiment. According to the dummy pattern DMP7, an electromagnetic noise or the like generated around the dummy pattern DMP7 can be shut off more effectively.

More specifically, in the dummy pattern DMP7, non-forming areas NT (NT1 to NT4) are arranged in such a Cantor set as mentioned above as an example of a fractal pattern shape. When an electromagnetic wave is introduced into the dummy pattern DMP7, the electromagnetic wave resonates in each of the non-forming areas NT1 to NT4. At a predetermined wavelength, an electromagnetic field with an intensity corresponding to the seventh power of ten of the incoming electromagnetic wave is generated within the non-forming areas NT formed in the shape of Cantor set.

It is preferable that the aforesaid predetermined wavelength and the direction of wavelength (the reciprocal of a spatial frequency) of Restricted Design Rules (RDR) be coincident with each other. An electromagnetic wave or the like propagated by the adoption of RDR gathers in the interior of the non-forming areas NT formed in the shape of Cantor set without being propagated to peripheral circuits. Thus, with the dummy pattern DMP7, an electromagnetic noise or the like generated around the dummy pattern DMP7 can be shut off more effectively.

Eighth Embodiment

Figure 11:
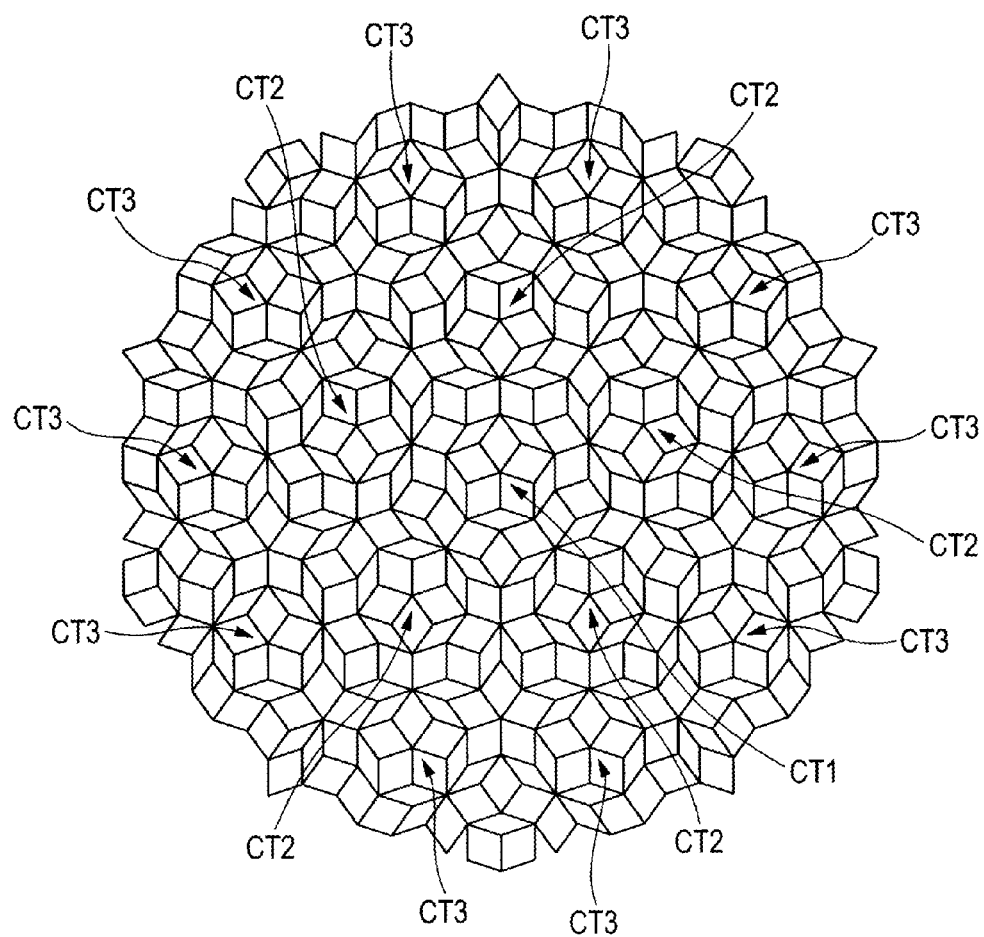
FIG. 11 is a plan view showing a Penrose tile pattern in connection with an eighth embodiment of the present invention.

A dummy pattern DMP8 in this eighth embodiment will be described with reference to FIGS. 11 and 12. First, a description will be given about Penrose tile pattern with reference to FIG. 11. Penrose tile pattern is a shape devised by an English physicist, Roger Penrose.

Penrose tile pattern is a shape in which two types of rhombuses are spread all over a plane to fill up the plane. It has a five-time symmetry, but does not have any periodical pattern. One of the two rhombuses which constitute Penrose tile pattern is comprised of an acute angle of 72° and an obtuse angle of 108°, while the other rhombus is comprised of an acute angle of 36° and an obtuse angle of 144°.

On Penrose tile pattern are formed plural regular decagons including five adjacent rhombuses of the same shape. By the regular decagons including five adjacent rhombuses of the same shape is meant regular decagons centered at CT1, CT2 and CT3 shown in FIG. 11.

Figure 12:
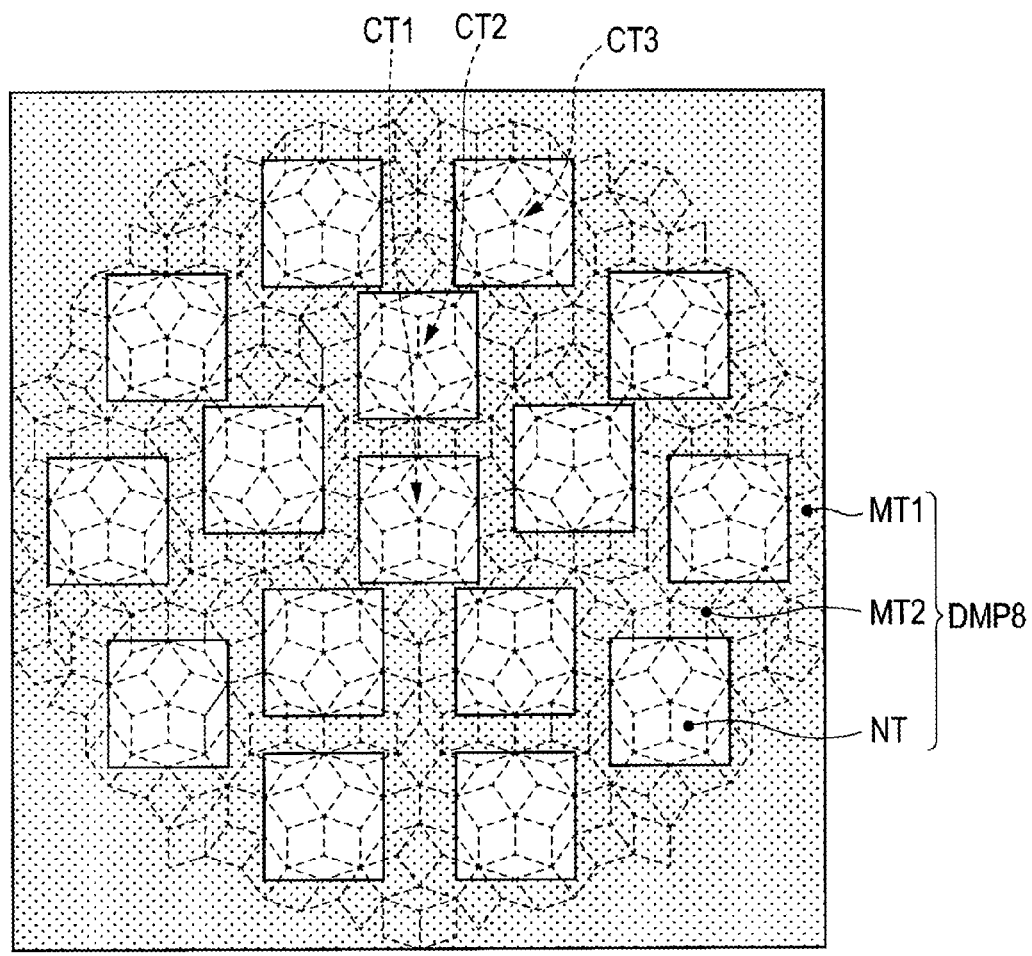
FIG. 12 is a diagram showing a dummy pattern used in a semiconductor integrated circuit according to the eighth embodiment.

Referring to FIG. 12, in the dummy pattern DMP8 in this embodiment, plural non-forming areas NT are formed in a generally quadrangular shape (or a generally square shape). In the case of defining Penrose tile pattern on the dummy pattern DMP8, the non-forming areas NT are arranged so as to include predetermined areas which are arranged in five-time symmetry within Penrose tile pattern.

For example, in the case of defining Penrose tile pattern on the dummy pattern DMP8, the non-forming areas NT are preferably arranged so as to each include the foregoing regular decagon (a regular decagon including five adjacent rhombuses of the same shape). In this case, one of the non-forming areas NT is disposed so as to include a regular decagon centered at the center CT1. Another non-forming area NT is disposed so as to include a regular decagon centered at the center CT2. The center CT2 is positioned at an outer periphery one periphery outside the center CT1. A further non-forming area NT is disposed so as to include a regular decagon centered at the center CT3. The center CT3 is positioned at an outer periphery still one periphery outside the center CT2.

Also with the dummy pattern DMP8 it is possible to obtain the same functions and effects as in the first embodiment. In the dummy pattern DMP8, the non-forming areas NT are each formed in a shape not having periodicity, whereby an electromagnetic noise or the like generated around the dummy pattern DMP8 can be shut off effectively.

Other Examples in First to Eighth Embodiments

The dummy patterns in the first to eighth embodiments may be formed so as to further have an aberration monitoring function. In this case, dummy patterns are formed in space areas around an aberration monitor-oriented functional module (e.g., SRAM module). For example, six dummy patterns are formed in space areas. Of the six dummy patterns, three are formed so that a periodical direction is a lateral direction (a direction orthogonal to a direction opposite to the aberration monitor-oriented functional module) and so that a periodical pitch changes relatively like large, medium and small. The other three patterns are formed so that a periodical direction is a longitudinal direction (a direction parallel to a direction opposite to the aberration monitor-oriented functional module) and so that a periodical pitch changes relatively like large, medium and small. With this configuration it becomes possible to further add the aberration monitoring function to the dummy pattern.

The dummy patterns in the first to eighth embodiments may be configured to further have an electrical noise shut-off function. In this case, each dummy pattern is formed in a space area around, for example, memory, analog or high-frequency element. The dummy pattern is formed so as to have two periodical patterns (spatial frequencies). The two periodical patterns are configured so that their periodical direction and the direction opposite to an electric noise shut-off-oriented functional module (e.g., analog module) are coincident with each other. The two periodical patterns are arranged in parallel along the direction opposite to the functional module. With this configuration it becomes possible to further add an electric noise shut-off function to the dummy pattern.

The dummy patterns in the first to eighth embodiments may be configured to further have a magnetic noise shut-off function. In this case, each of the dummy patterns in the first to eighth embodiments has an annular metal portion which encloses the outer periphery of the dummy pattern. The part other than the metal portion is formed of a dielectric film. In the case where the semiconductor integrated circuit is provided with a magnetic sensor module, the dummy pattern is formed in a space area around a functional module other than the magnetic sensor module. A dummy pattern not having a magnetic noise shut-off function is formed in a space area around the magnetic sensor module so as not to obstruct the magnetic detection of the magnetic sensor module. With this configuration it becomes possible to further add a magnetic noise shut-off function to the dummy pattern.

The dummy patterns in the first to eighth embodiments may be configured to further have an alignment measuring function. In this case, two dummy patterns are disposed in two space areas respectively. After forming the two dummy patterns, a deviation width in the periodical direction between one dummy pattern and the other dummy pattern is measured. With this configuration, alignment between the site of a functional module formed using the same mask as one dummy pattern and another site of a functional module formed using the same mask as the other dummy pattern can be measured properly.

Ninth Embodiment

With reference to FIGS. 13 to 18, a pattern lay-outing method SA for a semiconductor integrated circuit according to this ninth embodiment will be described below. The pattern lay-outing method SA is for lay-outing patterns of the semiconductor integrated circuits of the first to eighth embodiments.

Figure 13:
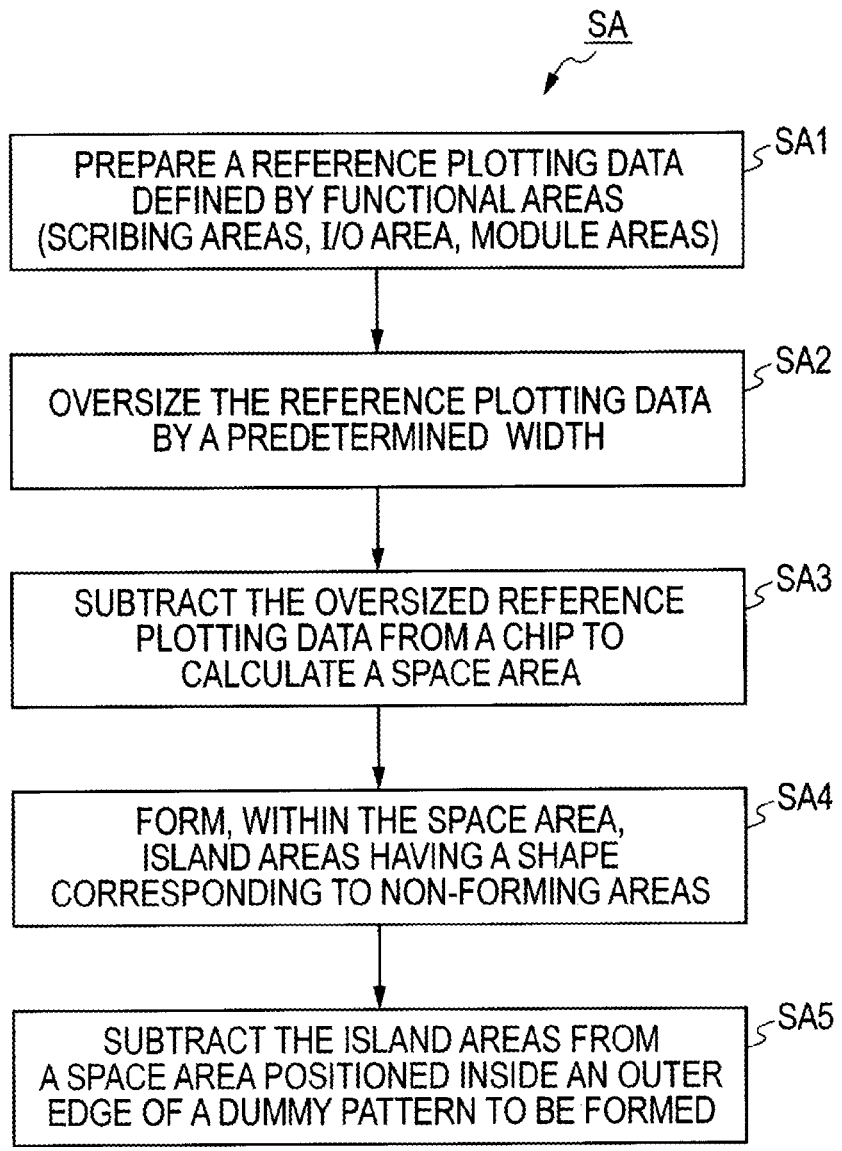
FIG. 13 is a diagram showing a pattern lay-outing method for a semiconductor integrated circuit according to a ninth embodiment of the present invention.

Referring to FIG. 13, the semiconductor integrated circuit pattern lay-outing method SA includes steps SA1 to SA5. The steps SA1 to SA5 will be described below in order.

Figure 14:
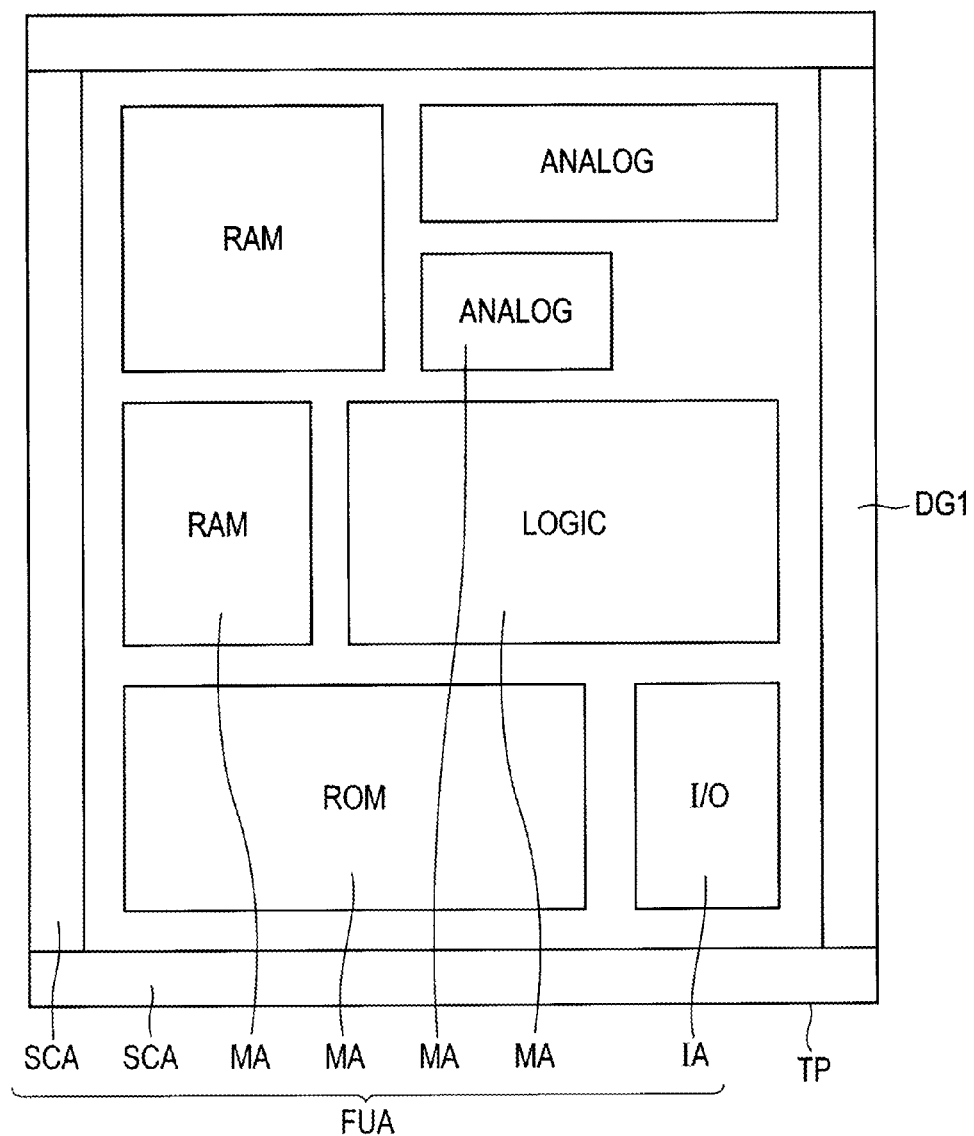
FIG. 14 is a first plan view showing the pattern lay-outing method for the semiconductor integrated circuit in the ninth embodiment.

Referring to FIG. 14, a plotting data DG1 (reference plotting data) is prepared in step SA1. The plotting data DG1 can be obtained by ° Ring all the functional areas FUA (scribing areas SCA, module areas MA and I/O area IA) arranged in the chip TP.

Figure 15:
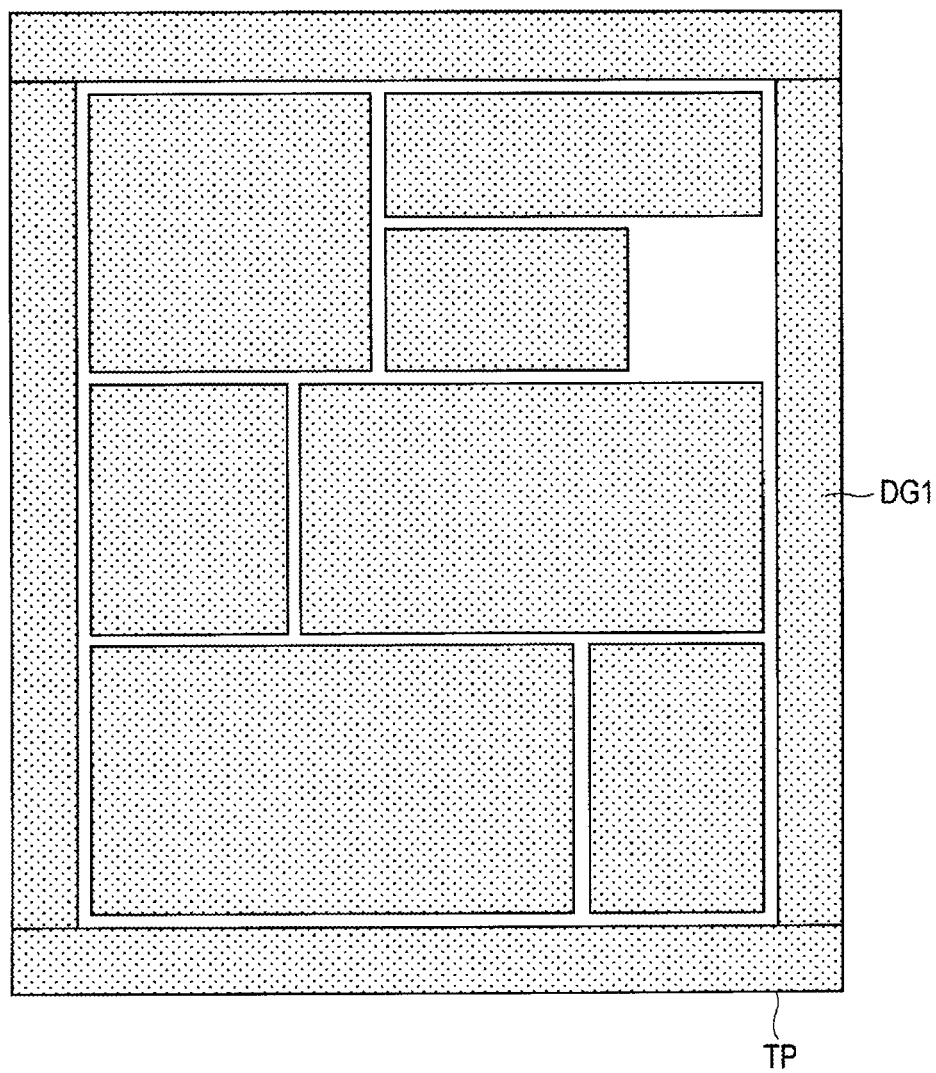
FIG. 15 is a second plan view showing the pattern lay-outing method for the semiconductor integrated circuit in the ninth embodiment.

Referring to FIG. 15, a plotting data DG2 is prepared in step SA2. The plotting data DG2 can be obtained by oversizing the plotting data DG1 (occupying area of the functional areas FUA) by a predetermined width. The predetermined oversizing width is calculated after ensuring a safe area for each of adjacent functional areas FUA. For example, the predetermined width is about 1 μm. It is preferable that the predetermined width be set for each generation of the semiconductor integrated circuit.

Figure 16:
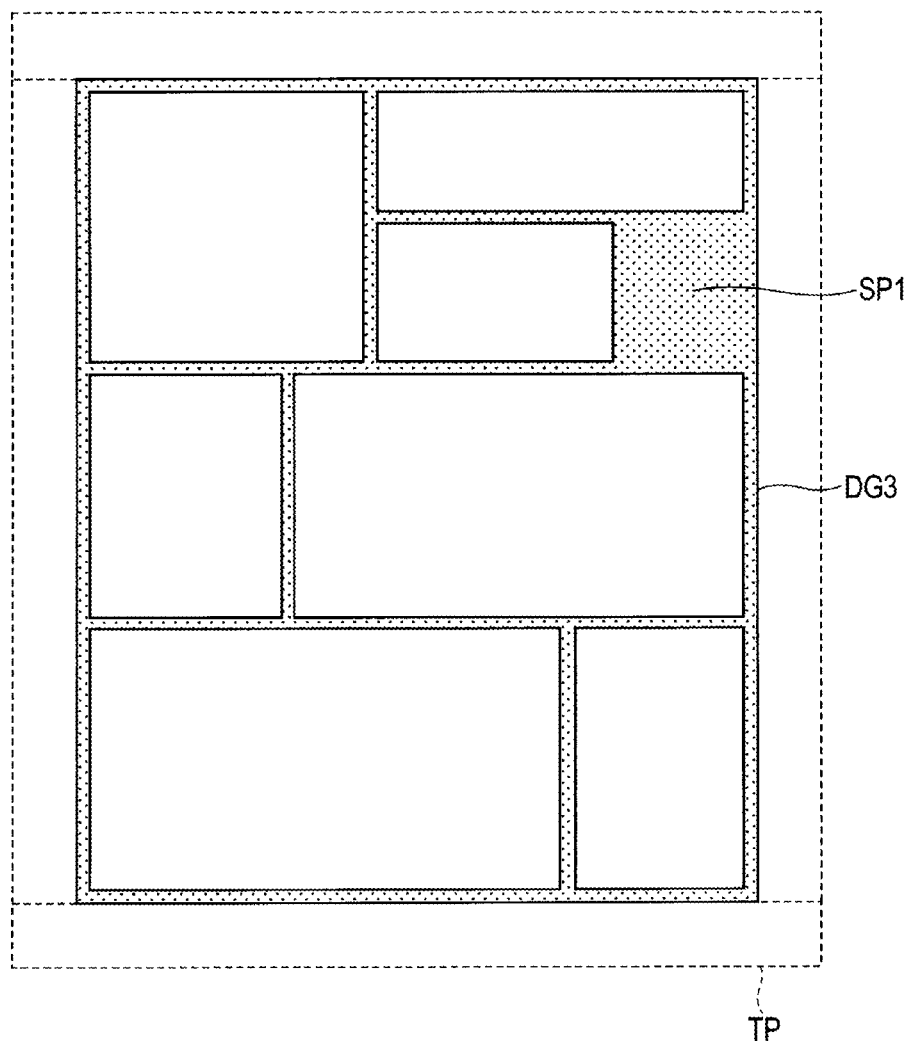
FIG. 16 is a third plan view showing the pattern lay-outing method for the semiconductor integrated circuit in the ninth embodiment.

Referring to FIG. 16, a plotting data DG3 is prepared in step SA3. The plotting data DG3 can be obtained by subtracting the plotting data DG2 obtained in step SA2 from the chip TP. In the chip TP, an area remaining after ensuring a safe area and after subtracting the plotting data DG2 is calculated as a space area SP1.

Figure 17:
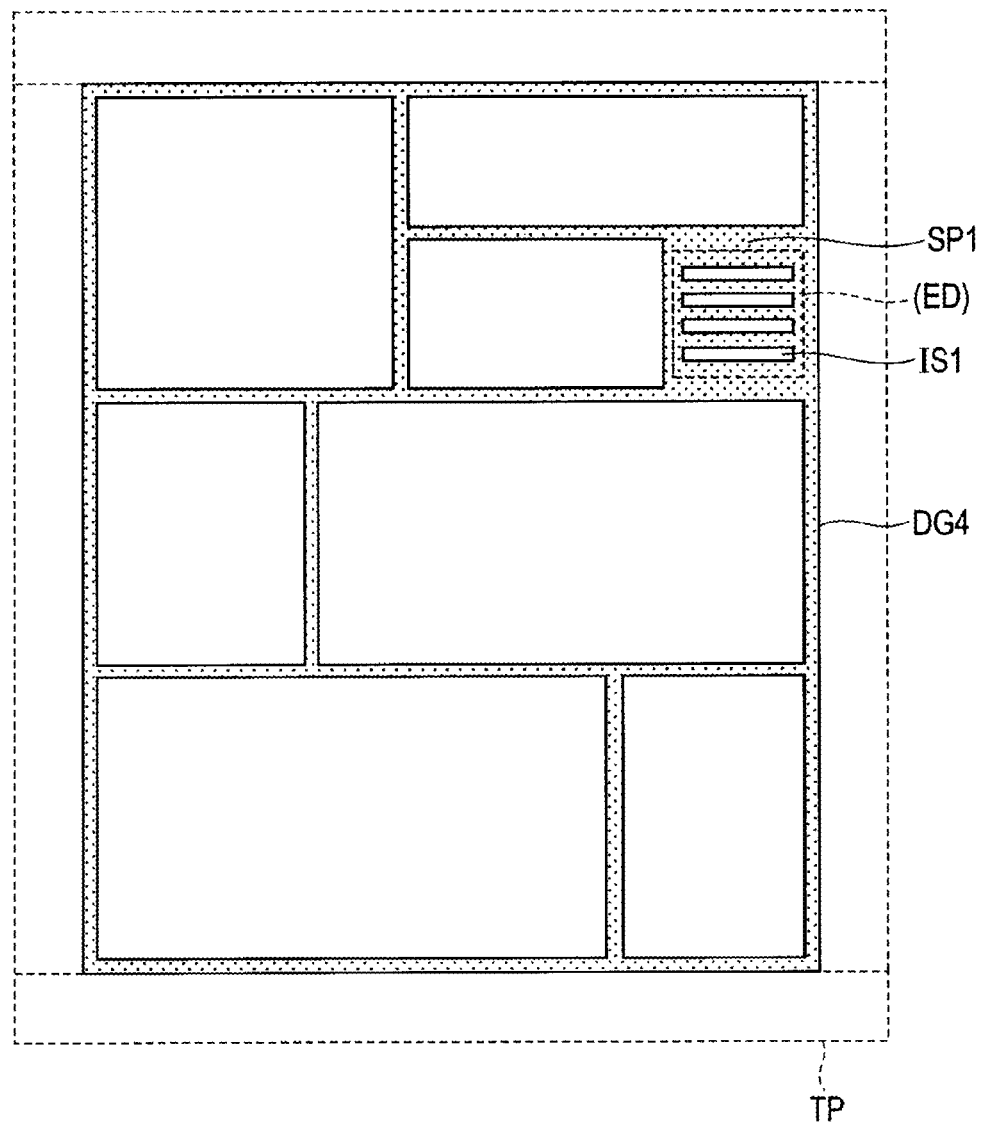
FIG. 17 is a fourth plan view showing the pattern lay-outing method for the semiconductor integrated circuit in the ninth embodiment.

Referring to FIG. 17, a plotting data DG4 is prepared in step SA4. The plotting data DG4 can be obtained by forming (subtracting) island areas IS1 in the space area SP1 in the plotting data DG3. The island areas 151 have a shape corresponding to non-forming areas NT (see FIG. 18) of the dummy pattern. In this embodiment, four band-like island areas IS1 are formed in the space area SP1 in the plotting data DG3.

Figure 18:
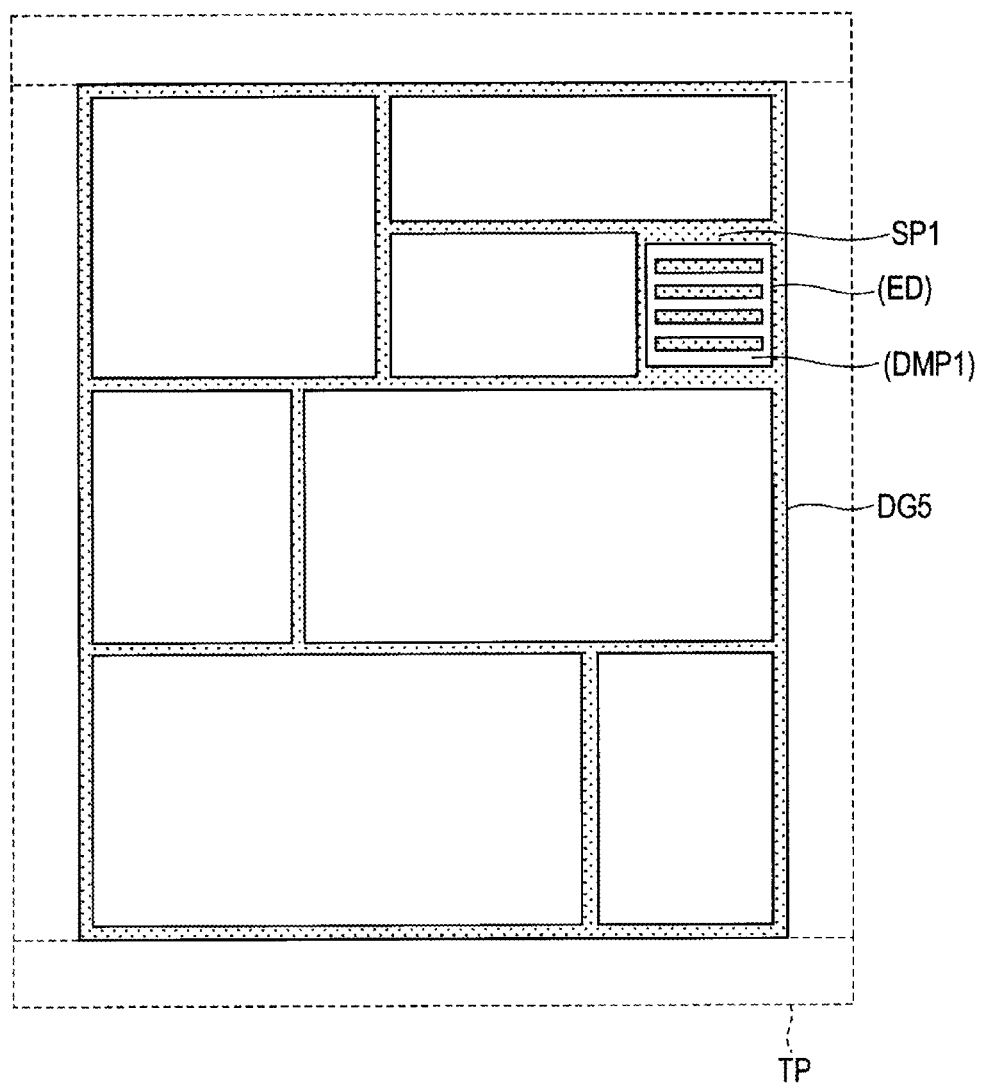
FIG. 18 is a fifth plan view showing the pattern lay-outing method for the semiconductor integrated circuit in the ninth embodiment.

Referring to FIG. 18, a plotting data DG5 is prepared in step SA5. In contrast with the plotting data DG4, the plotting data DG5 can be obtained by subtracting island areas IS1 from a space area SP1 which is positioned inside an outer edge ED of the dummy pattern DMP1 to be formed. In this way it is possible to lay out patterns of the semiconductor integrated circuit.

Tenth Embodiment

Figure 19:
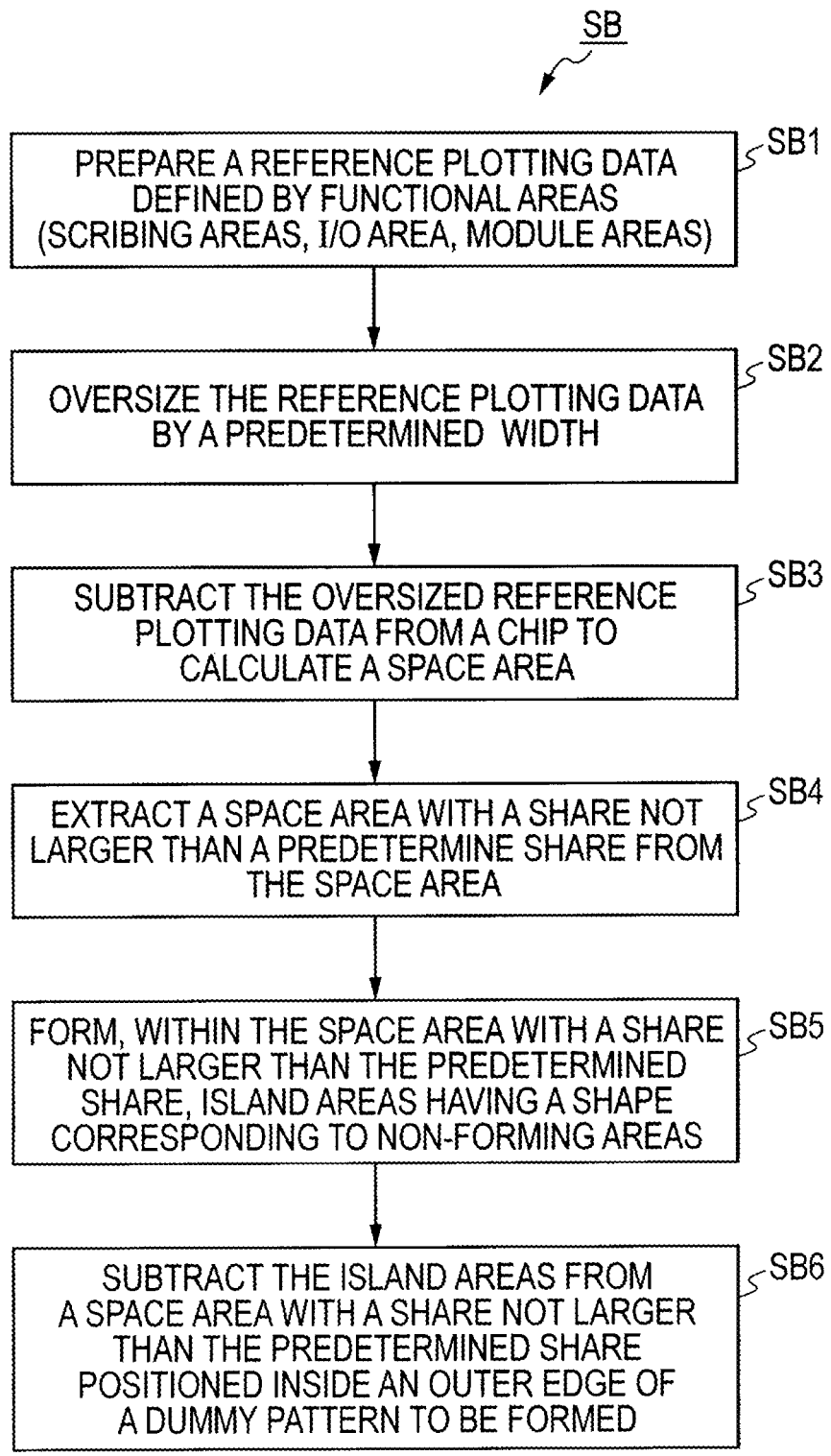
FIG. 19 is a diagram showing a pattern lay-outing method for a semiconductor integrated circuit according to a tenth embodiment of the present invention.

Referring to FIG. 19, a pattern lay-outing method SB for a semiconductor integrated circuit according to this tenth embodiment will be described. The pattern lay-outing method SB is another pattern lay-outing method for lay-outing patterns of the semiconductor integrated circuits of the first to eighth embodiments.

The semiconductor integrated circuit pattern lay-outing method SB includes steps SB1 to SB6. The steps SB1 to SB3 are the same as the steps SA1 to SA3 in the previous ninth embodiment.

In step SB4, a space area with a share not larger than a predetermined share on the chip is extracted from the interior of the space area (SP1, see FIG. 16) calculated in step SB3. A space area with a share not larger than the predetermined share on the chip can be extracted by ANDing the space area calculated in step SB3 with the area having a pattern share on the chip of not larger than the predetermined share.

Preferably, the space area with a share not larger than the predetermined share on the chip is calculated automatically using, for example, a predetermined program. Calculating the space area with a share not larger than the predetermined share on the chip automatically using, for example, a predetermined program can be designated semi-auto dummy.

In step SB5, like the step SA4 in the ninth embodiment, island areas are formed (subtracted) in the space area with a share not larger than the predetermined share. The island areas have a shape corresponding to the non-forming areas in the dummy pattern.

In step SB6, like the step SA5 in the ninth embodiment, with respect to the plotting data formed with the island areas, the island areas are subtracted from a space area positioned inside the outer edge of the dummy pattern to be formed. In this way it becomes possible to lay out patterns of the semiconductor integrated circuit.

According to the semiconductor integrated circuit pattern lay-outing method SB according to this embodiment it is possible to obtain a semiconductor integrated circuit improved in the uniformity of pattern share.

Semiconductor integrated circuits and pattern lay-outing methods for the same have been described above by way of embodiments of the present invention, but it should be considered that all the embodiments disclosed above are illustrative in all points without being limitative. It is contemplated that the scope of the present invention is defined by the scope of claims and that meanings equivalent to the scope of claims and all changes falling under the scope of claims are included in the scope of the present invention.

The present invention is applicable advantageously to semiconductor integrated circuits having a dummy pattern within a chip and pattern lay-outing methods for the same.

What is claimed is:

1. A semiconductor integrated circuit comprising:
   functional areas formed within a chip and including scribing areas, module areas and an I/O area; and
   a dummy pattern formed in a space area within the chip,
   the space area being defined between the functional areas, within any of the functional areas, and/or at a position spanning an area where any of the functional areas is formed and an area formed with none of the functional areas,
   the dummy pattern including:
   a first metal portion formed in the shape of a frame and defining an outer edge of the dummy pattern;
   a second metal portion positioned on an inner periphery side of the first metal portion and formed so as to be continuous with the first metal portion; and
   a plurality of non-forming areas positioned on the inner periphery side of the first metal portion in an area where the second metal portion is not formed.

2. The semiconductor integrated circuit according to claim 1, wherein the non-forming areas have shapes comprising two or more kinds of shapes.

3. The semiconductor integrated circuit according to claim 1,
   wherein the non-forming areas are formed in a generally quadrangular shape and are disposed so as to be included within a plurality of predetermined areas respectively on the inner periphery side of the first metal portion,
   wherein the predetermined areas are a plurality of squares each having a one side length ratio satisfying Fibonacci sequence, the squares being arranged adjacently and spirally in order from shorter to longer one side length, and
   wherein the first metal portion, the second metal portion and the non-forming areas are configured so that the dummy pattern has self-analogy as a whole.

4. The semiconductor integrated circuit according to claim 1,
   wherein the non-forming areas are arranged in the shape of a fractal pattern, and
   the first metal portion, the second metal portion and the non-forming areas are configured so that the dummy pattern has self-analogy as a whole.

5. The semiconductor integrated circuit according to claim 1,
   wherein the non-forming areas are each formed in a generally quadrangular shape and are arranged so as to include predetermined areas over a Penrose tile pattern defined on the inner periphery side of the first metal portion, and
   wherein the predetermined areas are arranged in five-time symmetry within the Penrose tile pattern.

* * * * *